United States Patent [19]
Rönnquist et al.

[11] 4,139,659
[45] Feb. 13, 1979

[54] THIN COMPOSITE WIRE SAW WITH SURFACE CUTTING CRYSTALS

[75] Inventors: Axel G. Rönnquist, Sollentuna; Erik T. Lindahl, Solna; Nicolay S. Stoilov, Tyreso, all of Sweden

[73] Assignee: Lumalampan AB, Stockholm, Sweden

[21] Appl. No.: 799,839

[22] Filed: May 23, 1977

Related U.S. Application Data

[60] Division of Ser. No. 582,681, Jun. 2, 1975, Pat. No. 4,055,700, which is a continuation-in-part of Ser. No. 502,836, Sep. 3, 1974, abandoned.

[51] Int. Cl.² .................. C23C 11/08; C23C 13/04; C23C 11/10; C23C 11/14
[52] U.S. Cl. ............................. 427/249; 427/248 J; 427/255
[58] Field of Search ................ 427/248 J, 249, 250, 427/405, 419 F, 255

[56] References Cited

U.S. PATENT DOCUMENTS

| | | | |
|---|---|---|---|
| 2,951,474 | 9/1960 | Wayland | 83/788 X |
| 3,353,526 | 11/1967 | Daem et al. | 126/15 |
| 3,437,511 | 4/1969 | Hough | 428/380 X |
| 3,549,413 | 12/1970 | McCandless et al. | 428/389 |
| 3,668,006 | 6/1972 | Higgins et al. | 427/52 |
| 3,669,850 | 6/1972 | Draca | 427/205 X |
| 3,811,920 | 5/1974 | Galasso | 428/389 X |
| 3,811,940 | 5/1974 | Douglas et al. | 428/389 X |
| 3,868,230 | 2/1975 | Krukonis | 428/379 X |
| 3,964,937 | 6/1976 | Post et al. | 427/248 J |

*Primary Examiner*—James R. Hoffman
*Attorney, Agent, or Firm*—Flynn & Frishauf

[57] ABSTRACT

A composite metal wire saw having a thin wire core and integral therewith hard cutting crystals with cutting edges projecting irregularly from the wire core surface. The cutting crystals form a layer between 1.5 and 10 μm. Preferably, the composite saw has an intermediate fine-grained layer between 1 and 5 μm and being thinner than the surface layer. The composite saw is prepared by heating the core wire and depositing the cutting crystals from the vapor phase.

9 Claims, 4 Drawing Figures

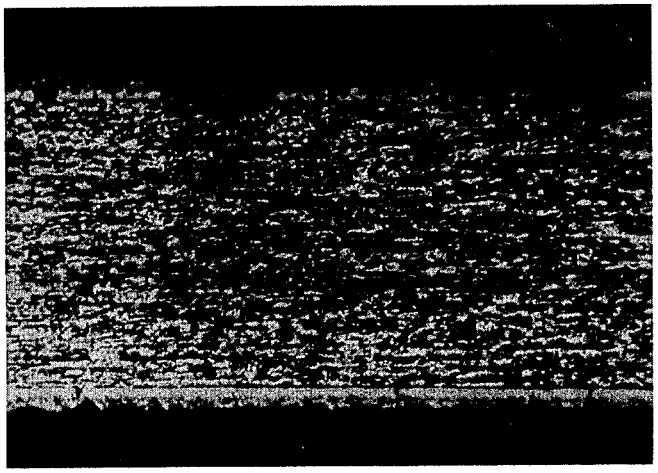
FIG.IA

THIN COMPOSITE WIRE SAW WITH SURFACE CUTTING CRYSTALS

This is a division of application Ser. No. 582,681 filed June 2, 1975 (now U.S. Pat. No. 4,055,700) which is a continuation-in-part application of Ser. No. 502,836 filed Sept. 3, 1974, now abandoned.

BACKGROUND OF THE INVENTION

A method of sawing or cutting is known in which a metal wire is passed through a suspension containing hard cutting particles. These particles adhere to the metal wire which is brought to the work piece which is to be cut. The metal wire having the cutting particles on its surface is brought into contact with the work piece and suitable pressure applied resulting in a sawnotch being formed in the work piece as a consequence of the effect of the hard particles thereon. This method has been used inter alia for sawing semi-conductor materials; the wire usually consisting of tungsten and the particles usually consisting of diamond or alumina, etc. The advantages of this method are that very thin saw-notches can be obtained by selecting a very thin tungsten wire and a suspension containing fine-grained particles, with consequent minimal loss of material. The disadvantages of the aforesaid described method is that the cutting particles only lightly adhere to the wire and readily are detached therefrom when the cutting wire contacts the workpiece resulting in low product output and increased wear of the wire.

SUBJECT MATTER OF THE PRESENT INVENTION

The present invention provides a cutting wire in which the said cutting particles which in the prior art only lightly adhering to the surface of the wire are replace by specified crystals which are formed by a chemical reaction and are permanently a part of the surface of the cutting wire. The cutting wire is heated by passing electric current through it. It is passed through a reaction chamber containing gaseous substances which on thermal decomposition form hard crystals on the wire surface. These hard crystals form a cutting surface.

The present invention therefore provides a composite metal saw having a wire core between about 10 and 500 $\mu$m and preferably between 20 and 250 $\mu$m thick. The wire core has hard cutting crystals with cutting edges projecting irregularly from the wire core surface. The cutting crystals form a surface layer between 1.5 and 10 and preferably between 5 and 8 $\mu$m thick. The composite wire saw preferably also has a layer intermediate between the core and the cutting surface which is formed integral therewith. The intermediate layer is a fine-grained layer between about 1 and 5 and preferably 1.5 and 3 $\mu$m thick. The intermediate layer is equal to or thinner than the surface layer. The composite saw wires are prepared by vapor deposition of the cutting surface layer. Vapor deposition coating is well known in the literature. (For example, see Powell, "Vapor-Plating," John Wiley Sons, New York, 1955.)

A BRIEF DESCRIPTION OF THE DRAWINGS

In the drawings:

FIG. 1a is a magnified photograph of a cross-section of a composite saw wire of the present invention;

DETAILED DESCRIPTION OF THE INVENTION

Figure 1B:
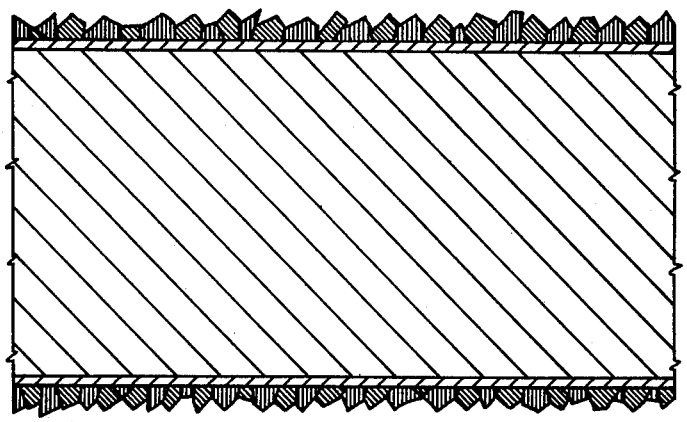
FIG. 1b is a diagrammatic depiction of a longitudinal cross-section of a composite saw wire of the present invention.

The composite saw wire has a core which is of a high tensile strength metal or alloy, such as tungsten, molybdenum, tantalum, osmium, and rhenium, and alloys thereof.

The cutting surfaces are preferably boron, or borides, nitrides and/or carbides. They are preferably selected from the group consisting of boron, and the borides, nitrides, and carbides of the transition metals and silicon.

Vapor deposition which is plating from the gaseous phase is usually used in order to provide a surface having special mechanical, chemical, electrical or optical properties. The usual object of this technique of coating in the prior art is to give a closely adherent and smooth coating. In order to obtain the object which is the subject of the present invention, it was necessary to modify the known vapor coating technique and carry it out in a manner counter to that taught by the prior art.

Owing to the fact that microscopic unevenness (irregularities) are always present at the surface of a metal wire which has been drawn, these surface irregularities can be used as the substrate for obtaining condensation nuclei on the wire surface. This results because the conditions for formation of crystals on such irregular surfaces are more favorable than the conditions for the formation of crystals on the surrounding area. Applicants have discovered that when under the aforesaid situation the above-noted condensation nuclei are subjected to slow crystalization at high temperature, they form primary crystals which increase in size without the concomitant formation of a considerable number of additional primary crystals. This produces large crystals with irregular edges projecting from the surface.

The desired slow crystallization can be obtained by utilizing low concentrations of one or more of the reaction gas components. This can be achieved, for instance, by dilution with inert gas; by using a large excess of a component; and by carrying out the reaction at a lower total pressure of the gaseous mixture. It is also posssible by lowering the temperature to lower the reaction velocity. However, as the velocity of recrystallization is also reduced by lower temperature, many small crystals are obtained.

Good adherence of the surface cutting crystals on the wire is favored by the fact that there is a certain amount of diffusion on an atomic scale which takes place between the metal of the wire core and the surface crystals. These form a specified intermediate zone, the thickness of which need only be of atomic dimensions.

If the atoms of the surface crystals diffuse too deeply into the wire core, a strong bond between the surface crystals and the wire core is formed. However, we have discovered that an undesirable brittleness of the wire may be caused by new phases. These new phases result from reaction between the atoms of the wire core material and those of the surface crystals diffusing into the core. This brittleness has resulted in deteriorated bending and tensile strength which is a great disadvantage for the desired function of the saw wire, particularly with wire cores of very small dimensions.

The rate of diffusion of the material of the surface crystals increases with increased temperature. Therefore, the temperature may be selected so that the diffusion does not occur too deeply into the wire core. If the selected temperature which is useful to prevent difusion is so low that it is not possible to form suitable surface crystals, another solution to the problem must be used. Another solution to the problem is to select as the wire core a material in which the rate of diffusion of the surface crystals is lower. If this is not possible, the core material is first coated with a surface layer of a material which obstructs the diffussion of the surface crystal atoms into the core. When choosing, for example, tungsten or molybdenum as the core wire, it has found that it is necessary to form the desired large surface crystals of boron or SiC at a sufficiently high reaction temperature that there is an undesirable diffusion of boron, carbon and silicon, respectively, into the core material. To avoid the foregoing, it is desirable to provide an intermediate layer which may be formed at a lower temperature than the crystalline outer layer.

Thus, the present invention provides a composite metal wire for sawing substances, particularly hard substances in which the cuts (referred to sometimes as "kerfs") are small. This composite wire is produced by a two-stage deposition of crystals of hard substances from the vapor phase. Two layers are formed on the core wire; a thin intermediate layer on the core wire which is selected to provide maximum adherence without embrittling the core wire. The second thicker layer of crystals of a hard substance with sharp cutting edges is deposited during the second stage of the deposition on the intermediate thin layer.

The intermediate layer may be formed from the same hard materials, with the exception of boron and the borides which are specified hereinbefore for the outer cutting crystals. However, the form of the crystals is different in that the intermediate layer is a thinner layer of fine-grained crystals or an amorphous layer. The preferred intermediate layers are titanium carbide, titanium nitride, zirconium nitride, and silicon carbide. Titanium carbide and titanium nitride are particularly preferred.

The characteristics of the hard metals which may be utilized are disclosed in standard texts of powder metallurgy including the Schwartzkopf and Kieffer *Refractory Hard Metals*, Macmillan Company, 1953.

The invention is further illustrated in the following examples and the drawings:

EXAMPLE 1

A molybdenum wire 20–500 $\mu$m thick is coated with an intermediate diffusion-preventing layer of titanium carbide, 2–5 $\mu$m thick, by heating up to 1,400° C. for five seconds in an atmosphere of toluene, titanium tetrachloride, and hydrogen gas in a proportion of 0.2:1:10 at atmospheric pressure. Then a crystalline layer of silicon carbide is deposited by heating the wire to about 1,200° C. in an atmosphere of one part of methyl chlorosilane and 20–50 parts hydrogen gas at atmospheric pressure for 30 seconds to form crystals up to 10 $\mu$m. The resultant composite wire is useful for sawing solid bodies which are usually cut with silicon carbide, such as silicon, steel, tungsten, etc.

FIGS. 1a and 1b are respectively a photograph and a diagrammatic depiction of an enlargement of a longitudinal section through a 100 $\mu$m thick molybdenum wire coated with an intermediate layer of titanium carbide and an outer layer of coarse cutting crystals of silicon carbide.

EXAMPLE 2

A molybdenum or tungsten wire 20–500 $\mu$m is coated with an intermediate diffusion-prevention layer of titanium nitride 1–5 $\mu$m thick, by heating to about 1,400° C. for five seconds in an atmosphere of hydrogen gas, titanium tetrachloride, and nitrogen in a ratio of 10:2:1, at atmospheric pressure. A crystalline layer of boron is then deposited on said titanium nitride layer by heating to about 1,200° C. in an atmosphere of one part of boron trichloride and 30–75 parts of hydrogen gas at atmospheric pressure. A layer of sharp-edged boron cutting crystals up to 10 $\mu$m thick were formed during a reaction time 45 seconds. The wire cut the same materials noted in Example 1.

EXAMPLE 3

A molybdenum or tungsten wire 20–500 $\mu$m is coated with an intermediate diffusion-prevention layer of titanium nitride 1–5 $\mu$m thick as described in Example 2. This wire is then coated with a crystalline layer of silicon carbide as described in Example 1.

EXAMPLE 4

A molybdenum wire 20–500 $\mu$m coated with an intermediate diffusion-preventing layer of titanium carbide, 2–5 $\mu$m thick as described in Example 1. This wire is then coated with a crystalline layer of boron as described in Example 2.

Figure 2:
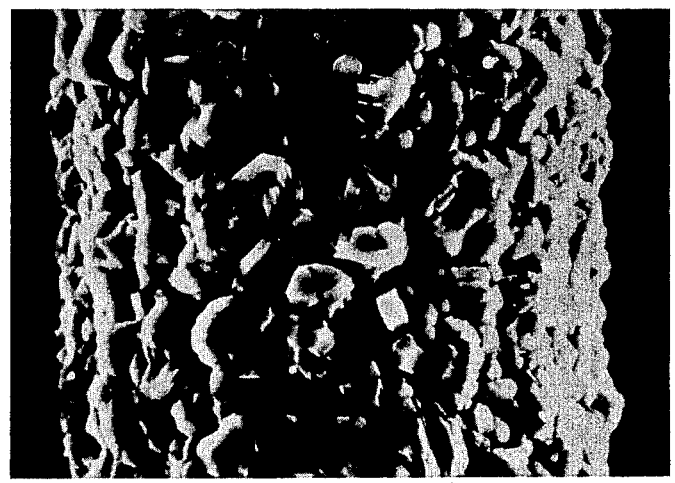
FIG. 2 is a magnified photograph of the surface of a composite saw wire of the present invention.

FIG. 2 depicts a photograph (magnified) of the surface of the molybden wire about 100 $\mu$m thick, coated with an intermediate layer of titanium nitride and having the outer cutting layer of boron crystals.

Figure 3:
FIG. 3 is a detailed, highly-magnified photograph (about 2200$\times$) of the wire shown in FIG. 2.

FIG. 3 is an enlargement (2200 magnification) of the wire of FIG. 2.

The selection of the diameter (thickness) of the wire core is determined by the width of groove (saw cut) required.

We claim:

1. A process for producing a composite metal saw wire having a drawn wire core with two concentric layers formed integrally on said core, comprising
    providing a drawn core wire having a thickness between 20 and 250 $\mu$m and comprising at least one metal selected from the group consisting of tungsten, molybdenum, tantalum, osmium and alloys thereof,
    vapor depositing an intermediate layer of fine-grained material selected from the group consisting of titanium carbide, titanium nitride, zirconium nitride, and silicon carbide in a thickness of about 1 and 5 $\mu$m on said drawn wire core from a gaseous mixture consisting essentially of (i) at least one gaseous substance which on heating yields, respectively, (a) titanium and carbon which vapor deposit as titanium carbide, (b) titanium and nitrogen which vapor deposit as titanium nitride, (c) zirconium and nitrogen which vapor deposit as zirconium nitride, and (d) silicon and carbon which vapor deposit as silicon carbide, and (ii) a large dilution of an inert gas, and
    then vapor depositing on said intermediate layer and outer layer having a thickness of between 1.5 and 10 $\mu$m and being at least as thick as said intermediate layer of hard cutting silicon carbide or boron crystals of substantially larger size than the crystals forming said intermediate layer and having cutting edges projecting irregularly outwardly from said saw wire from a gaseous mixture consisting essentially of (i) at least one gaseous substance which on heating yields, respectively, (a) silicon and carbon which vapor deposit as silicon carbide, and (b) boron which vapor deposits as boron, and (ii) a large dilution of an inert gas, said intermediate layer being formed of a different material than said outer layer.

2. The process of claim 1 wherein said drawn wire core is a molybdenum wire or a tungsten wire.

3. The process of claim 2 wherein said intermediate layer is formed from crystals of titanium carbide or titanium nitride.

4. The process of claim 3 wherein said hard cutting crystals forming said outer layer are silicon carbide crystals.

5. The process of claim 3 wherein said hard cutting crystals forming said outer layer are boron crystals.

6. The process of claim 2 wherein said wire core is molybdenum, said intermediate layer is titanium carbide, and said outer layer is silicon carbide.

7. The process of claim 2 wherein said wire core is molybdenum, said intermediate layer is titanium carbide, and said outer layer is boron.

8. The process of claim 2 wherein said wire core is molybdenum, said intermediate layer is titanium nitride, and said outer layer is silicon carbide.

9. The process of claim 2 wherein said wire core is tungsten, said intermediate layer is titanium nitride, and said outer layer is silicon carbide.

* * * * *